(12) United States Patent
Itoh et al.

(10) Patent No.: US 7,646,088 B2
(45) Date of Patent: Jan. 12, 2010

(54) ADHESIVE SHEET FOR LIGHT-EMITTING DIODE DEVICE AND LIGHT-EMITTING DIODE DEVICE

(75) Inventors: Koji Itoh, Sagamihara (JP); Shigeyoshi Ishii, Sagamihara (JP)

(73) Assignee: 3M Innovative Properties Company, St. Paul, MN (US)

( * ) Notice: Subject to any disclaimer, the term of this patent is extended or adjusted under 35 U.S.C. 154(b) by 378 days.

(21) Appl. No.: 10/597,349

(22) PCT Filed: Jan. 13, 2005

(86) PCT No.: PCT/US2005/001269

§ 371 (c)(1), (2), (4) Date: Jul. 21, 2006

(87) PCT Pub. No.: WO2005/076376

PCT Pub. Date: Aug. 18, 2005

(65) Prior Publication Data

US 2008/0237617 A1    Oct. 2, 2008

(30) Foreign Application Priority Data

Feb. 2, 2004    (JP) .............................. 2004-025723

(51) Int. Cl.
*H01L 21/44* (2006.01)
(52) U.S. Cl. ........................... 257/687; 257/98; 257/783
(58) Field of Classification Search .................. 257/98, 257/783, 687
See application file for complete search history.

(56) References Cited

U.S. PATENT DOCUMENTS

| 5,362,421 | A | 11/1994 | Kropp et al. |
|---|---|---|---|
| 6,051,652 | A | 4/2000 | Kawate et al. |
| 6,309,502 | B1 | 10/2001 | Hiroshige et al. |
| 2003/0026979 | A1 | 2/2003 | Nakasuga et al. |

FOREIGN PATENT DOCUMENTS

| JP | 62141083 | 6/1987 |
|---|---|---|
| JP | 2948412 | 9/1999 |
| JP | 2000-269555 | 9/2000 |
| JP | 2000353828 | 12/2000 |
| JP | 2001144333 | 5/2001 |
| WO | WO 00/06661 | 2/2000 |

OTHER PUBLICATIONS

Article: Taguchi, "Future Prospect and Application of White LED Lighting System Technologies," *CMC Publication*, (date unknown but believed to be prior to the date of the filing of the present application), pp. 211-213.

*Primary Examiner*—Long Pham
(74) *Attorney, Agent, or Firm*—Dean M. Harts; Yen Tong Florczak

(57) ABSTRACT

[Problem] To provide an adhesive sheet which is used for a light-emitting diode device, and which is free from cracks and peeling off of the adhered portions. [Means for Solving the Problem] An adhesive sheet for a light-emitting diode device, which comprises a thermoplastic polymer containing epoxy groups and a compound containing functional groups which are addition reactive with the epoxy groups or a polymerization catalyst which can effect a ring opening polymerization of the epoxy groups, and in which said thermoplastic polymer is cross-linked so that its flowability is restrained.

9 Claims, 1 Drawing Sheet

ADHESIVE SHEET FOR LIGHT-EMITTING DIODE DEVICE AND LIGHT-EMITTING DIODE DEVICE

TECHNICAL FIELD

This invention relates to an adhesive sheet for a light-emitting diode device for adhering a heat-radiating plate, a reflecting plate or a phosphor sealing frame to a substrate or box, and which has a proper elastic modulus and comprises a thermoplastic polymer containing epoxy groups. The invention relates also to a light-emitting diode device using the adhesive sheet

BACKGROUND ART

A light-emitting diode device has various advantages such as low power consumption, high power, small-sized and light-weighted properties, etc. Therefore, it is expected to replace the position of conventional light sources such as electric light bulbs and fluorescent bulbs. Further, it is expected to be developed to new usages such as back lights for cell phones and LCD panels using its characteristic features. In order to increase the light emitting efficiency of the device, various proposals have been made, as described in non-patent literature 1 described later. For example, there have been proposed: a) to lower the temperature of the device by allowing heat to escape from the light-emitting diode by a heat radiating plate; b) to take out the light emitted from the light emitting diode by a reflecting plate; and c) to lower the temperature of the device by allowing heat to escape from the light-emitting diode by using a material such as metal which has high heat conductivity, for printed circuit boards and boxes.

FIGS. 1 and 2 each shows a cross sectional view illustrating the use of an adhesive in a conventional diode device. In FIG. 1, a light-emitting diode device 1 has a fluorescent material-containing resin 7 placed on a light-emitting diode element 5 which is connected to a circuit board 3, and the resin 7 is covered by a lens 8. A reflecting plate 4 is positioned around the lens 8 to increase light efficiency. On the side opposite to the light-emitting diode element 5 relative to the circuit board 3, there is provided a heat-radiating plate or box 2. In FIG. 1, an adhesive 6 is used to bond the heat-radiating plate or box 2 to the circuit board 3, or to bond the reflecting plate 4 to the circuit board 3. In FIG. 2, a different type of a light emitting diode device 1 is shown in which a fluorescent material-containing resin sealing frame 9 is used in place of the reflecting plate. In FIG. 2, an adhesive is used to bond the frame 9 to a circuit board 3.

The light-emitting diode device is produced generally by mounting a light-emitting diode element 5 to a circuit board 3, and adhering thereto a reflecting plate 4, a heat-radiating plate or box 2 or a fluorescent material-containing sealing frame 9, etc. Subsequently, a liquid resin is filled to seal the phosphor and the light-emitting diode element 5 and/or to fix a lens 8, and heated to solidify them.

The light-emitting diode device should have a high brightness and long operating life. When the brightness level is raised, there increases the heat from the light-emitting diode element and the adhesive used should have a high, continuous heat-resistance. Because the light-emitting diode device is thought to be used outdoor, it should have a long operating life and a weather resistance and, accordingly, the adhesive used should have a high continuous heat-resistance and weather resistance.

In conventional light-emitting diode devices, there have been used adhesives such as liquid type thermo-setting adhesives as described in Patent publication 1 and sheet-type thermoplastic adhesives as described in Patent publication 2.

When the liquid type thermo-setting adhesive is used, a large amount of the adhesive gets out from the adhering portion at an adhering process, and adheres to the light-emitting element which causes a reduction in the light-emitting efficiency of the device. Further, because much gas is generated, chemical substances are adhered to the light-emitting diode element and the light-emitting efficiency of the device is damaged. The sheet-type thermoplastic adhesive is poor in heat resistance. Therefore, when such adhesive is used it cannot endure the heat and stress applied thereto in the sealing process of the light-emitting diode element, and the molding resin gets through adhering parts. Further, there arises a problem that the adhesive cannot endure the heat applied during the operation of the light-emitting diode device, and it may be peeled off.

In Patent publication 3, there is described a sheet-type thermo-setting adhesive of an epoxy resin or polyimide resin material, in addition to said liquid type epoxy resin or polyimide resin-based adhesives. Although there is no concrete description about what type of the epoxy resin or polyimide resin was used, it is not possible to obtain sufficient adhesive power when a normal epoxy resin is used in a small adhering area. Further, because an epoxy resin has a high elastic modulus ($10^8$ Pa or more) after hardening of the resin, there is a problem that it cannot endure heat and stress produced and applied to the resin at the sealing process of the light-emitting diode element, resulting in cracks and peeling off of the adhered portions. in addition, there occur cracks and peel-off at the adhered portion by the stress due to the difference in the linear expansion coefficients between circuit boards and the heat radiating plate or reflecting plate, caused by the heat generated from the light-emitting diode element or the heat generated at the solder re-flowing process.

The above-mentioned liquid type thermo-setting adhesives and sheet-type thermoplastic adhesives of a general epoxy resin base contain a high amount of low molecular weight components in their resin compositions. Accordingly, much amount of gas is generated from the adhesives by the heat produced in the production or provision process of the light-emitting diode devices and by the heat applied during the operation of the devices. This is a great problem because the generated gas adheres to the light-emitting diode element, causing a decrease in the light-emitting efficiency.

[Non-patent publication 1] Application and Future Prospect of White LED illumination System Technology (CMC Publishing)

[Patent publication 1] Patent Publication No. 2,948,412

[Patent publication 2] Kokai (Jpn. Unexamined Patent Publication) No. 2000-353828

[Patent publication 3]Kokai (Jpn. Unexamined Patent Publication) No. 2001-144333.

DISCLOSURE OF THE INVENTION

The purpose of the invention is to provide an adhesive sheet which is used for a light-emitting diode device, and which is free from cracks and peeling off of the adhered portions.

MEANS FOR SOLVING THE PROBLEM

According to one aspect of the invention, there is provided an adhesive sheet for a light-emitting diode device, which comprises a thermoplastic polymer containing epoxy groups, a compound containing functional groups which are addition reactive with epoxy groups, or a polymerization catalyst which can effect ring opening polymerization of the epoxy groups, and in which said thermoplastic polymer is cross-linked so that its flowability is restrained.

According to the invention, thermoplastic polymer containing epoxy groups (epoxy groups-containing thermoplastic polymer) is used. Therefore, volatile components and gases which are generated at thermo-setting reactions are remarkably reduced and whereby it is prevented the decrease in the light-emitting efficiency of the light-emitting diode device caused by these gases.

Further, because the flowability of the thermoplastic polymer containing epoxy groups is restrained previously by being cross-linked, it is possible to prevent materials from flowing into the light-emitting diode element and from causing pollution during the hardening and bonding process.

In addition, the thermoplastic polymer containing epoxy groups is more flexible after hardened than those based on a normal low-molecular weight epoxy resin and, therefore, cracks and peeling off of the adhered portions can be prevented.

BEST MODE FOR CARRYING OUT THE INVENTION

Thermoplastic Polymer Containing Epoxy Groups (a)

The adhesive sheet for a light-emitting diode device comprises a thermoplastic polymer containing epoxy groups (epoxy group-containing thermoplastic polymer: polymer (a)). The polymer is previously cross-liked so that its flowability is restrained and, therefore, it is possible to prevent materials from flowing into the light-emitting diode element and from causing a pollution problem at the hardening and bonding process.

The thermoplastic polymer containing epoxy groups (polymer (a)) comprises, for example, a polymer obtained by copolymerizing a vinyl-containing monomer with an epoxy groups-containing monomer which is copolymerizable with said vinyl-containing monomer. Examples of the vinyl-containing monomer include α-olefins such as ethylene, propylene and 1-butene; aromatic vinyl such as styrene and α-methylstyrene; conjugated diene such as butadiene and isoprene. Examples of epoxy groups-containing monomer include unsaturated glycidyl carboxylate esters such as glycidyl acrylate, glycidyl methacrylate and glycidyl itaconate; unsaturated glycidyl ethers such as allyl glycidyl ether and methallyl glycidyl ether. A terpolymer obtained by polymerizing the above vinyl-containing monomer and epoxy groups-containing monomer, with third monomers which are polymerizable with these monomers can be used as the epoxy groups-containing thermoplastic polymer of the invention. Examples of the third monomer include saturated vinyl carboxylate such as vinyl acetate and vinyl propionate; unsaturated alkyl carboxylate esters such as methyl(meth)acrylate, ethyl(meth) acrylate. The epoxy groups-containing thermoplastic polymer may be a copolymer wherein the third monomer is grafted to the vinyl groups containing monomer and epoxy groups containing monomer, or terpolymer or higher polymer which include one or more monomer other than above mentioned monomers. These polymers may be employed alone or in a mixture of two or more thereof. A preferred epoxy groups-containing thermoplastic polymer is ethylene-glycidyl(meth)acrylate copolymer. The terms "(meth)acrylate" or "(meth)acryl" herein used mean acrylate and/or methacrylate, and acryl and/or methacryl, respectively. Concrete examples of the epoxy groups-containing polyolefinic polymer usable for the invention include products with commercial names of REXPARK RA Series produced by Nippon Polyolefin KK, BONDFIRST Series produced by Sumitomo Kagaku Kogyo KK, SEPOLJOHN G Series produced by Sumitomo Seika KK, etc.

The polymer (a) in the composition composing the adhesive sheet is used generally in an amount of 10 to 95 mass % based on the total mass of the adhesive sheet. When the polymer (a) is used in a too small amount, the cohesive power of the hardened product is insufficient while when the polymer (a) is used in a too much amount, the adhesion force of the sheet to the material to be adhered may be insufficient at the heating and hardening process.

Thermoplastic Polymer Containing No Epoxy Groups (b)

Except for the thermoplastic polymer containing epoxy groups (a), the adhesive sheet of the invention may contain thermoplastic polymer (polymer (b)) containing no epoxy groups (b). The polymer (b) plays a plasticizing effect at heat melting stage of the adhesive sheet, resulting in increasing the adhesion to the material to be adhered. Further, the polymer (b) provides flexibility to the adhesive layer obtained after the adhesive sheet is hardened. Accordingly, the hardened adhesive releases the internal stress when the adhesive layer is applied with heat cycles at the solder re-flowing process, preventing the adhesive from being peeled off. The polymer (b) may comprise, for example, a polymer obtained by copolymerizing the vinyl groups-containing monomer and a monomer which is copolymerizable with the vinyl groups-containing monomer and which contains carboxylic acid ester groups. Examples of the vinyl groups-containing monomer may be those mentioned above with respect to the thermoplastic polymer containing epoxy groups. Examples of the monomer containing carboxylic acid ester groups include vinyl acetate, methyl acrylate, ethyl acrylate, butyl acrylate and methyl methacrylate. Specifically, commercially available products can be used such as trade name "Rexpearl RB" series and "J-Rex" series of Japan Polyolefins Co., Ltd., trade name "NUC" series of Nippon Unicar Co., Ltd., trade name "Acryft" series of Sumitomo Chemical Co., Ltd., trade name "Evaflex" series of Dupont-Mitsui Polychemicals Co., Ltd. and the like.

The polymer (b) in the composition composing the adhesive sheet is used generally in an amount of 4 to 80 mass % based on the total mass of the adhesive sheet. When the polymer (b) is used in a too small amount, the composition prior to the time it is hardened is not well applied and it is difficult to make a film. Further, heat adhesion properties may be decreased. When the polymer (b) is used in a too much amount, thermo-setting properties may be decreased.

The polymers (a) and (b) used for the invention have each a cross-linking structure whereby their flowability at heat-melting stage is restrained. The cross-linking structure may be obtained by irradiating an electron ray, for example, to the polymer. Otherwise, the cross-linking structure may be formed by ring opening polymerization of the epoxy groups of the polymer in which a polymerization catalyst is contained, by heat or a radiation ray such as ultraviolet ray.

Polymerization Catalyst

The polymerization catalyst used for forming the cross-linking structure is the one which initiates a ring opening polymerization of epoxy groups by heat or a radiation ray such as ultraviolet ray. The polymerization catalyst may be those which initiates a cationic polymerization by a catalytic action or which initiates an anionic polymerization. Examples of the cationic polymerization catalyst include organic metal complexes comprising ligands such as cyclopentadienyl anion, indenyl anion, (xylene)hexafluoroantimonate anion, and hexafluorophosphate anion and a metallic cation of the metal such as iron, chromium, molybdenum, tungsten, manganese, rhenium, ruthenium and osmium; fluoboric complex, aromatic sulfonium salt, aliphatic sulfonium salt, aromatic iodonium salt, aromatic diazonium salt, and aromatic ammonium salt. Examples of the anionic polymerization catalyst include imidazole compounds, carbamate compounds and dicyanamide.

The polymerizing catalyst is used generally in an amount of 0.01 to 10 mass % based on the total mass of the adhesive composition composing the adhesive sheet.

The cross linking structure should be limited to the range such that the flow property of the adhesive sheet prior to be hardened is suitable for the adhesion to the light-emitting diode device. Specifically, the cross linking structure is preferably controlled so that the flow property prior to the hardening of the adhesive sheet is in the range between 110 and 210%. When the flow property is over said range, the adhesive flows too much and gets out of the place to be adhered and adheres to the light-emitting diode element, causing a decrease in the light emitting efficiency of the diode device. On the other hand, when the flow property is less than the range above, the adhesive cannot wet the material to be adhered sufficiently, and lacks adhesion force when it is used in a small adhering area. Further, the adhesive cannot endure heat and stress generated at the stage of sealing the light-emitting diode element, causing peeling off of the adhering parts.

The term "flow property" used herein can be calculated by the following formula, when an adhesive sheet punched to a 6 mm diameter disc and with a predetermined thickness (300 μm, for example) is sandwiched between a glass plate and a copper plate, followed by being pressed under heat at 180° C. for 10 seconds with a pressure of 1,050 N/cm$^2$:

Flow property (%)=[diameter (mm) after being pressed]/[diameter (mm) before being pressed]× 100.

The cross linking structure is formed preferably after the starting material of the adhesive sheet is made to a film, in a manner such that the sheet has the flow property within the above range. When the epoxy groups-containing thermoplastic polymer such as epoxy groups-containing polyolefinic copolymer is cross-linked by irradiating an electron beam, the beam is radiated with an accelerating voltage of generally 150 to 500 keV, and an irradiation amount of 10 to 400 kGy, although the electron beam is not restrained. When the polymer is cross-linked by a polymerization catalyst using an ultraviolet ray or heat, the cross-linking reaction proceeds with opening of epoxy rings. In that case, the epoxy groups should be maintained unreact to the extent that the thermosetting property of the adhesive sheet of the invention is sufficiently retained after the irradiation of the ultraviolet ray or application of heat. The ultraviolet ray is irradiated in an amount within the range between 100 to 10,000 mJ/cm$^3$ (cumulative amount at 360 nm). To have the polymer cross linked by a polymerization catalyst under heat, the cross-linking reaction is carried out at 130 to 200° C. for about 60 seconds. The electron ray or ultraviolet ray may be irradiated a plurality of times.

Compounds Having Functional Groups Capable of Addition Reacting with Epoxy Groups (c)

The adhesive sheet of the invention needs to have thermosetting properties after a cross-linking structure is introduced into polymers (a) and (b). Therefore, the adhesive sheet should contain a polymerization catalyst or a hardener or both of them. When the adhesive sheet is irradiated with an electron ray for the introduction of the cross-linking structure and when it contains no polymerization catalyst, it contains compound having functional groups capable of addition reacting with epoxy groups (c), as a hardener. When the adhesive sheet contains the polymerization catalyst, it may preferably contain the compound (c) although the compound (c) is not indispensable. The compound (c) is one which contains two or more reactive functional groups such as carboxyl groups, phenolic hydroxyl groups, amino groups and mercapto groups. Examples of the compound (c) include alkylphenol novolac resin, and 9,9'-bis(3-700-4-aminophenyl)fluorine.

Concretely, as a rosin containing carboxyl groups, there may be mentioned HALLIMAC series (trade name) products produced by Harima Kasei KK, and KE series (trade name) products produced by Arakawa Kagaku Kogyo KK. Further, as a compound having mercapto groups, there may be mentioned EPICURE QX40 (produced by Japan Epoxy resin KK).

Compound (c), when adopted, is used in an amount of 1 to 20 mass % based on the total mass of the adhesive sheet. When the amount of compound (c) is too small, the curing properties and heat adhesion properties of the adhesive sheet may be decreased while when the amount of the compound (c) is too much, the adhesion strength of the sheet after hardened may be insufficient.

The adhesive sheet of the invention may contain various types of additives. Examples of the additives include antioxidants such as a primary oxidation inhibitor of a phenolic or amine base and a secondary oxidation inhibitor of a phosphor or sulfur base, ultraviolet ray absorbers, fillers (inorganic fillers, conductive particles, pigments, etc.), lubricants such as wax, rubber components, cross-linking agents and hardening accelerators.

Embodiments of Preferred Adhesive Sheets

The adhesive sheet of the invention has preferably flow property of 110% to 210% before curing. The adhesive sheet suitable for the present invention has a tensile elasticity modulus E' in the range between $1 \times 10^5$ and $5 \times 10^7$ Pa, at 100° C. to 260° C. after curing. In consideration of the solder re-flow step of a light-emitting diode device, the tensile elasticity modulus is preferably within the range between $8 \times 10^5$ and $5 \times 10^6$ Pa. When the tensile elasticity modulus is less than $1 \times 10^5$ Pa, the adhesive is too soft to endure the heat and stress applied thereto during the sealing process of the light-emitting diode element, and the molding resin gets through adhering parts. Further, there arises a problem that the adhesive cannot endure the heat applied during the operation of the light-emitting diode device, and it may be peeled off. When the tensile elasticity modulus is higher than $5 \times 10^7$ Pa, the adhesive is too hard. As a result, cracks or delamination of the adhered portion may be occurred by the stress due to the heat from the light-emitting diode device element or during a solder reflow process, because of the difference between linear heat-expansion coefficient of the heat-radiation plate or reflecting plate and that of the circuit board.

The words "tensile elasticity modulus" mean an elastic modulus determined by a tensile testing method wherein a plurality of the adhesive sheet are heated to make a laminate having a thickness of about 0.3 mm, and the laminate is hardened in an oven at 150° C. for two hours, followed by pulling the hardened laminate using a viscoelasticity meter with 6.28 rad/sec. by a temperature step mode (measurements were effected at every 10° C. from 40° C. to 260° C.).

The adhesive sheet of the invention which satisfies the requirements mentioned above comprises a thermosetting resin composition comprising a polyolefin copolymer containing epoxy groups in its molecule, for example, ethylene-glycidyl(meth)acrylate copolymer (a') (10 to 95 mass %), a polyolefin copolymer containing carboxylic acid ester groups in its molecule, for example, ethylene-alkyl(meth)acrylate copolymer (b') (4 to 80 mass %), and a rosin containing carboxyl groups in its molecule (c') (1 to 20 mass %), and wherein said composition is irradiated with a radiation ray such as an electron ray or ultraviolet ray to form a cross-linking structure therein.

The ethylene-glycidyl(meth)acrylate copolymer (a') contains repeating units obtained by polymerizing a monomer mixture of glycidyl(meth)acrylate with ethylene, in an amount of normally 50 mass % or more, and preferably 75 mass % or more based on the total of the polymer. The mass ratio (G:E) of the glycidyl(meth)acrylate(G) to the ethylene (E) in the repeating units is preferably in the range from 50:50 to 1:99, and more preferably from 20:80 to 5:95. When the content of ethylene is too small, the solubility of copolymer ('a) in copolymers (b') and (c') is decreased, resulting in an insufficiently uniform composition and difficulty in forming a cross-linking structure. When the content of the ethylene is too great, the adhering performance may be reduced.

Copolymer (a') is contained in an amount of normally 10 to 95 mass % in the adhesive composition composing the adhesive sheet. When the amount is less than 10 mass %, the effect of increasing the cohesive power of the hardened composition may be decreased while when the amount is over 95 mass %, the adhesion strength of the adhesive sheet upon heat-pressing may be decreased. From these points, copolymer (a') is used preferably in an amount of 30 to 88 mass %, and more preferably 40 to 85 mass %.

Ethylene-allyl(meth)acrylate copolymer (copolymer (b')) acts to increase the heat adhesion properties of the adhesive sheet. Further, it acts to form a cross linking structure between molecules of copolymer (b') and/or copolymer (a') by an electron beam irradiation to enhance the elastic modulus of the adhesive composition at the stage the adhesive sheet is heat-pressed. Because copolymer (b') absorbs less water than copolymer (a'), copolymer (b') acts to increase the water resistance of the adhesive sheet or its precursor. Further, because the softening point of copolymer (b') is lower than that of copolymer (a'), copolymer (b') acts to relax the internal stress when the hardened composition receives heat cycles, and to increase the adhesion properties.

The alkyl group of the alkyl(meth)acrylate has carbons in the range between 1 and 4. When the number of carbon atoms in the alkyl group is more than 4, the elasticity modulus of the composition after cross-linked may not be increased.

Concrete examples of copolymer (b') include a bipolymer of alkyl(meth)acrylate and ethylene, and a terpolymer of alkyl(meth)acrylate, vinyl acetate and ethylene. These copolymers (b') contain repeating units obtained by polymerizing alkyl(meth)acrylate with ethylene, in an amount of normally 50 mass % or more and preferably 75 mass % or more, based on the total mass of the polymer.

The mass ratio (A:E) of alkyl(meth)acrylate(A) to ethylene (E) contained in the repeating units is preferably in the range from 60:40 to 1:99, and more preferably from 50:50 to 5:95. When the content of ethylene is too small, an increase in the elasticity modulus of the composition to be caused by the cross-linking structure may not be expected. When the content of ethylene is too great, the adhesion force may be reduced. Copolymer (b') can be used alone or in a mixture of two or more compounds.

Copolymer (b') is contained in an amount of normally 4 to 80 mass % in the adhesive composition of the adhesive sheet. When the amount is less than 4 mass %, the coating properties of the precursor and the heat adhesion properties of the adhesive composition may be decreased, and the cross linking structure may not be easily formed by an electron ray. When the amount is over 80 mass %, the thermo-setting property of the composition may be reduced. From these points, copolymer (b') is used preferably in an amount of 10 to 60 mass %, and more preferably 15 to 50 mass %.

Rosin (rosin (c'), used as a material for the adhesive composition of the adhesive sheet, has carboxyl groups and reacts by a thermal setting treatment with said copolymer (a') to harden the adhesive composition under heat whereby the adhesive force of the composition is increased. Examples of the rosin include a gum rosin, wood rosin, tall oil rosin and substances in which these rosins are chemically modified, such as polymerized rosins.

The rosin (c') has an acid value of preferably 100 to 300 and more preferably 150 to 250. When the acid value is too small, its reactivity with copolymer (a') may be decreased, causing a reduction in hardness of the composition while when the acid value is too high, stability (the effect of suppressing an increase in viscosity) at forming the adhesive sheet under heat may be damaged. The term "acid value" herein used is the value expressed by mg (milligram) of potassium hydroxide required for neutralizing 1 g of a sample.

Rosin (c') has a softening point of preferably 50 to 200° C. and more preferably 70 to 150° C. When the softening point is too low, there occurs a reaction with copolymer (a') during storage, to lower the storage stability. When the softening point is too high, its reactivity with copolymer (a') may be decreased, causing a reduction in hardness of the composition. The "softening point" herein used is the value obtained by following the procedure according to JIS K 6730.

The rosin (c') is contained in an amount of normally 1 to 20 mass % in the adhesive composition of the adhesive sheet. When the amount is less than 1 mass %, the hardness and heat adhesion properties of the composition may be reduced, while when the amount is over 20 mass %, the adhesion properties of the composition after having been hardened may be lowered. For these reasons, the rosin should be contained in an amount of preferably 2 to 15 mass %, and more preferably 3 to 10 mass % in the composition.

The words "heat adhesion properties" mean the adhesion properties of the adhesive sheet to a substance to be adhered at the time the adhesive sheet is melted to closely contact with the substance, cooled and solidified prior to be thermal curing.

Production of the Adhesive Sheet

The adhesive sheet of the invention can be produced, for example, as follows:

When no polymerization catalyst is used for forming a cross-linking structure to adjust the flow property, ingredients, such as polymer (a), polymer (b) and compound (c), are mixed together to prepare a precursor for the adhesive composition. When a polymerization catalyst is used, it is added to a mixture of polymer (a), polymer (b) and optional compound (c) to prepare a precursor. Subsequently, the precursor is coated onto a substrate to prepare a precursor film. Examples of the substrate include plastic films wherein surfaces are treated to be easily peeled off, such as polyethylene terephthalate (PET) film and fluoro-polymer, from which the adhesive sheet may be easily peeled off. A preferred substrate is polyethylene terephthalate of which surface is treated with silicone. A solvent coating method may be adopted wherein a precursor dissolved in an organic solvent is coated and the solvent is removed. However, a non-solvent coating method is more preferable which comprises melting the precursor under heat and kneading it preferably in an extruder, and making a precursor film with using a T-die or the like. This is because volatile gas is prevented from remaining in the adhesive sheet, according to the non-solvent coating method. Subsequently, the film precursor is irradiated with an electron ray or ultraviolet ray, or heat is applied to the film to form a cross-linking structure between molecules of the polymer, whereby the adhesive sheet is produced.

The adhesive sheet of the invention is used for the adhesion in light-emitting diode devices and is provided in a thickness of 10 μm to 500 μm.

The adhesive sheet of the invention can be provided in a form of a single layer sheet as obtained by the method mentioned above, a two layers sheet wherein one surface of a substrate such as a non-woven cloth, glass cloth and plastic film is coated with the adhesive of the invention, and a three layers sheet wherein both surfaces of the substrate as mentioned above are coated with the adhesive of the invention.

Method of Using the Adhesive Sheet

The adhesive sheet of the invention is used for the adhesion in a light-emitting diode device. FIGS. 1 and 2 each shows a cross-section view of a light-emitting diode device. In FIG. 1, a light-emitting diode device 1 has a fluorescent material-containing resin 7 placed on a light-emitting diode element 5 which is connected to a circuit board 3, and the resin 7 is covered by a lens 8. A reflecting plate 4 is positioned around the lens 8 to increase light efficiency. On the side of the circuit board 3 opposite the light-emitting diode element 5, there is provided a heat-radiating plate or box 2. In a different type of a light-emitting diode device 1 shown in FIG. 2, a fluorescent material-containing resin sealing frame 9 is used in place of a reflecting plate. This sealing frame 9 generally has functions both of reflectivity and heat-radiation property. The adhesive sheet of the invention is placed as an adhesive 6 at the position between a heat-radiating plate or box 2, or a reflecting plate 4 or fluorescent material-containing resin sealing frame 9 and a circuit board 3 to bond them by heating and pressing the sheet at a temperature of about 130 to 180° C. for several seconds to several minutes. Otherwise, the sheet may be heated to melt, at 70 to 120° C. and cooled to be provisionally adhered to elements. Subsequently, the sheet is pressed under heat at a temperature of 130 to 180° C. for several seconds to several minutes. Thereafter, the sheet is retained at 150 to 200° C. for about one to two hours to be finally hardened whereby a strong bond is obtained.

1. Production of Adhesive Sheet

An adhesive composition was prepared by mixing CG5001/NUC6570/KE604=60/35/5.0 mass %, by a procedure as described below. CG5001 is an ethylene-glycidylmethacrylate copolymer (copolymer (a)) (mass ratio of ethylene unit:glycidylmethacrylate unit=82:18, BONDFAST, a tradename of the product produced by Sumitomo Kagaku Kogyo KK). NUC6570 is an ethylene-ethylacrylate copolymer (copolymer (b)) (mass ratio of ethylene unit:ethylacrylate unit=75:25, the product produced by Nippon Unicar KK). KE604 is a rosin containing carboxyl groups (compound (c)) which has an acid value of 242 (PINECRYSTAL, a tradename of the product produced by Arakawa Kagaku Kogyo KK).

First, polymer (b) was kneaded with compound (c) at 110° C. for 10 minutes in a kneading apparatus to form pellets comprising a substantially uniform mixture. The pellets were mixed with polymer (a) at 110° C. for 2 minutes so that all ingredients may be uniformly contained by the same kneading apparatus, whereby a precursor was prepared.

The precursor thus obtained was made to a film of 100 μm thickness on a polyethylene terephthalate peeling liner by an extruder and a T-die. An electron ray was irradiated to the precursor film using a linear filament type accelerator to form an adhesive layer. The electron ray was irradiated in an amount of 200 kV, 140 kGy. Thus, samples (adhesive sheet 1) of the adhesive sheet of the invention were obtained.

EXAMPLE 2

A precursor composition was prepared by mixing 70 mass % of an ethylene-glycidylmethacrylate copolymer (BOND-FAST CG5001, a trade name of the product produced by Sumitomo Kagaku Kogyo KK, mass ratio of ethylene unit:glycidylmethacrylate unit=82:18), 29.5 mass % of ethylene-ethylacrylate copolymer (NUC-EEA 6070, a trade name of the product produced by Nippon Unicar KK, and 0.5 mass % of a cationic polymerization catalyst ($Ar_3SSBF_6$, wherein Ar means an aromatic functional group), by a kneading apparatus until they are uniformly mixed. The mixing operation was carried out at 110° C. for 10 minutes.

The precursor composition was sandwiched between two sheets of PET film (peeling film), passed through a knife gap heated to 140° C. to obtain a film type precursor having a 100 μm thickness. An ultraviolet ray was irradiated to the precursor by a high pressure mercury lamp of 20 W/cm positioned 20 cm away from the precursor. The radiation was radiated in an amount of 630 mJ/cm² to obtain samples (adhesive sheet 2) of the adhesive sheet of the invention.

EXAMPLE 3

An adhesive sheet (adhesive sheet 3) was obtained by repeating the procedure of Example 1 except that an electron ray radiated film prepared from a mixture of a polyolefin copolymer containing epoxy groups/alkyl phenol/novolac resin/anti-oxidant was used.

Comparative Example 1

As the epoxy resin adhesive sheet, epoxy sheet FA-1360HF (produced by Nagase Chemtex KK, epoxy resin mixed film) was used (adhesive sheet 4).

Comparative Example 2

As the epoxy resin adhesive sheet, TSA-14 (produced by Toray KK, epoxy resin/polybutadiene mixed film) was used (adhesive sheet 5).

Comparative Example 3

As the epoxy resin adhesive sheet, AS2700 (produced by Hitachi Kasei Kogyo KK, epoxy resin/acrylic resin mixed film) was used (adhesive sheet 6).

2. Evaluation of Each of the Adhesive Sheets 2.1 Measurement of Elastic Modulus

Three pieces of respective adhesive sheet obtained by each of the Examples were heat-laminated to form an adhesive sheet having a total thickness of about 300 μm, and the laminated adhesive sheet was hardened in an oven at 150° C. for two hours. Subsequently, its elastic modulus was measured by a tensile testing method using a visco-elastic meter (RSAII, produced by Rheometric Scientific Company) at 6.28 rad/sec, by a temperature step mode ((measurement was effected at every 10° C. from 40° C. to 260° C.).

When the tensile elastic modulus E' at 100 to 260° C. is in the range between $8 \times 10^5$ and $5 \times 10^6$ Pa, the sheets were shown as ○ in Table 1, and the sheets wherein the tensile elastic modulus E' is in the range between $1 \times 10^5$ and $8 \times 10^5$ Pa or between $5 \times 10^6$ and $5 \times 10^7$ Pa were shown as Δ, and the sheets wherein the tensile elastic modulus E' is not in these ranges were shown as X.

2.2. Measurement of Flow Property

An adhesive sheet, from which a disc of about 6 mm diameter was punched out, was sandwiched between a glass plate (1.1 mm thickness) and a copper plate (0.5 mm thickness) and the diameter before heat-pressing was determined by an optical microscope. Subsequently, the sheet was heat pressed at 180° C. for 10 seconds with a pressure of 1,050 N/cm². The flow property was calculated based on the following formula.

Flow property (%)=[diameter (mm) after being pressed]/[diameter (mm) before being pressed]× 100.

The sheets were shown as ○ wherein their flow properties are in the range between 155 and 210%, and those of which flow properties are in the range between 110 and 155% were shown as Δ, and those of which flow properties are not in the range were shown as X.

2.3. Measurement of Resistance to High Temperature and High Moisture

An adhesive sheet was sandwiched between a polyimide film and a copper plate, was heat pressed at 200° C., for 10 seconds and at 50N/cM², and was hardened in an oven at 150° C. for two hours. 90° peel adhesive force of the sample was determined and taken as an initial value. Subsequently, the adhesive sheet was left for 168 hours in an oven at 121° C., 100% RH and 2 atm, and its 90° peel adhesive force was taken as the value after the sheet was aged.

Sheets of which adhesive force is 10N/cm² or over were shown as ○ while sheets of which adhesive force is less than said value were shown as X.

2.4 Evaluation of Storage Stability

The flow property mentioned earlier was determined for adhesive sheets stored in an oven at 40° C. for 12 days. The obtained flow property value was used as the storage stability and was calculated by converting the value, with taking the initial value of the flow property as 100.

The sheets were shown as ○ wherein their storage stability values are 90 or more and those of which values are less than 90 were shown as X.

2.5 Measurement of Generated Gas

Each of the adhesive sheets was heated at 200° C. for two hours, and the quantity of the generated gas were determined by a head space-GC (gas chromatography)method.

The sheets were shown as ○ wherein the amount of the generated gas is 0.3 wt % or less and those of which the amount is over 0.3 wt % were shown as X.

2.6 Evaluation of Re-flowability Resistance

Each of adhesive sheets was sandwiched between a polyimide film and a stainless plate, was heat pressed at 200° C., for 10 seconds and at 50N/cm², and was hardened in an oven at 150° C. for two hours. The sample was left in an oven at 30° C./70% RH for 72 hours to absorb moisture. Subsequently, the sample was placed in a hot plate at 210° C. to determine the time until when pop corn was generated. For each of examples, three samples were used. Sheets of which time the pop corn was generated is 30 seconds or longer were taken as successful. The pop corn means delamination at the adhesive interface and/or bubbling within the adhesive because of gas generation.

As the criteria for the re-flowability resistance, sheets of which all of three were successful were shown as ○, those in which one or two samples were successful were shown as Δ and those in which there is no successful sheet were shown as X.

TABLE 1

| Example No. | Raw material/features | Elastic modulus | Flow property | Resistance to high temperature and high moisture | Storage stability | Resistance to re-flowability | Gas generated |
|---|---|---|---|---|---|---|---|
| Example 1 | Epoxy groups-containing polyolefin 1 | ○ | ○ | ○ | ○ | ○ | ○ |
| Example 2 | Epoxy groups-containing polyolefin 2 | ○ | ○ | ○ | ○ | ○ | ○ |
| Example 3 | Epoxy groups-containing polyolefin 3 | Δ | ○ | ○ | ○ | Δ | ○ |
| Comparative Example 1 | Epoxy Resin 4 | X | X | X | X | ○ | ○ |
| Comparative Example 2 | Epoxy Resin 5 | ○ | ○ | X | X | ○ | ○ |
| Comparative Example 3 | Epoxy Resin 6 | ○ | ○ | X | X | ○ | X |

From the table above, it is clear that the adhesive sheet of the invention satisfies the requirements for adhesive applications for light-emitting diode devices, and it is demonstrated that the adhesive sheet of the invention has excellent properties.

Figure 1:
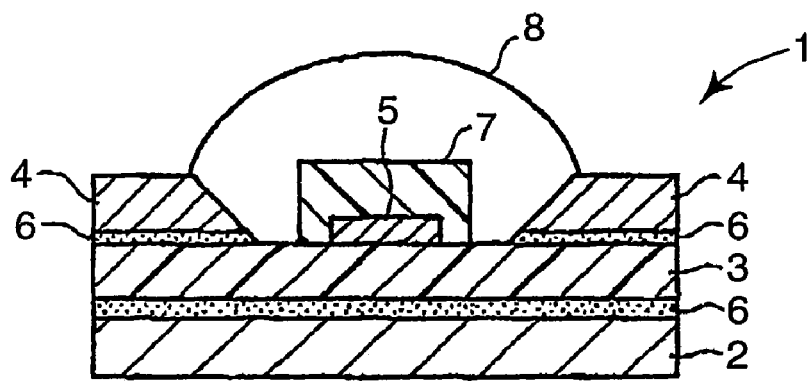
FIG. 1 is a sectional view of an embodiment of the light-emitting diode device of the invention.

The invention claimed is:

1. A light-emitting diode device comprising a light-emitting diode element, a circuit board, a fluorescent material-containing resin, a lens and a fluorescent material-containing resin sealing frame, wherein said circuit board is adhered to the sealing frame by an adhesive sheet comprising the reaction product of a thermoplastic polymer containing epoxy groups,
a thermoplastic polymer which contains no epoxy group, and
a polymerization catalyst which can effect a ring opening polymerization of the epoxy groups,
and in which said thermoplastic polymer is cross-linked so that its flowability is restrained
and wherein the cross-linking structure of said thermoplastic polymer is formed by ring opening polymerization of the epoxy groups by said polymerization catalyst with the irradiation of a ultraviolet ray or the application of heat.

2. A light-emitting diode device comprising a light-emitting diode element, a circuit board, a fluorescent material-containing resin, a lens and a fluorescent material-containing resin sealing frame, wherein said circuit board is adhered to the sealing frame by an adhesive sheet comprising the reaction product of 10 to 95 mass % of a polyolefin copolymer containing epoxy groups in its molecule, as a thermoplastic polymer containing epoxy groups,
4 to 80 mass % of a polyolefin copolymer containing carboxylic acid ester groups in its molecule, as a thermoplastic polymer containing no epoxy groups, and
1 to 20 mass % of a rosin containing carboxyl groups in its molecule, as a compound containing functional groups which are addition reactive with said epoxy groups, and wherein said composition is irradiated with an electron ray to form a cross-linking structure therein and in which each of said thermoplastic polymer is cross-linked so that its flowability is restrained.

3. The light-emitting diode device of claim 1, wherein the thermoplastic polymer flow property is 110 to 210%.

4. A light-emitting diode device according to claim 1, wherein said sealing frame has functions of reflectivity and heat-radiation property.

5. The light-emitting diode device of claim 1, further comprising a reflecting plate and a heat-radiation plate or box, wherein said circuit board is adhered by the adhesive sheet to the heat-radiation plate or box, or to the reflecting plate.

6. The light-emitting diode device of claim 1, wherein said thermoplastic polymer containing epoxy groups is obtained by copolymerizing a vinyl groups-containing monomer with an epoxy groups-containing monomer which is copolymerizable with said vinyl groups-containing monomer.

7. The light-emitting diode device of claim 2, wherein the thermoplastic polymer flow property is 110 to 210%.

8. A light-emitting diode device according to claim 2, wherein said sealing frame has functions of reflectivity and heat-radiation property.

9. The light-emitting diode device of claim 2, further comprising a reflecting plate and a heat-radiation plate or box, wherein said circuit board is adhered by the adhesive sheet to the heat-radiation plate or box, or to the reflecting plate.

* * * * *

UNITED STATES PATENT AND TRADEMARK OFFICE
CERTIFICATE OF CORRECTION

Figure 2:
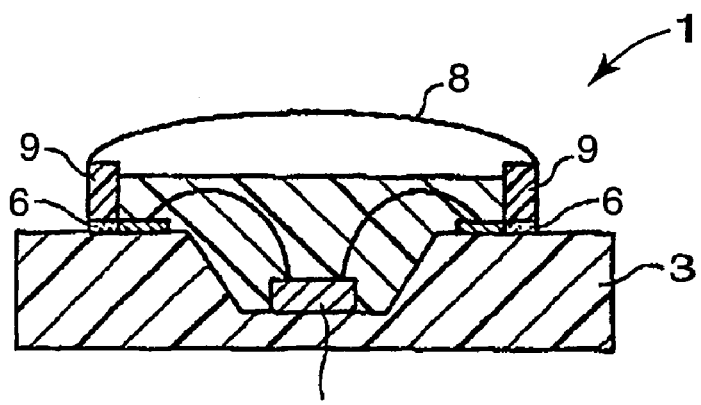
FIG. 2 is a sectional view of another embodiment of the light-emitting diode device.

PATENT NO. : 7,646,088 B2  Page 1 of 1
APPLICATION NO. : 10/597349
DATED : January 12, 2010
INVENTOR(S) : Koji Itoh It is certified that error appears in the above-identified patent and that said Letters Patent is hereby corrected as shown below:

Sheet 1 of 1
Fig. 1; Line 2, below "Fig. 1" insert -- PRIOR ART --.
Fig. 2; Line 2, below "Fig. 2" insert -- PRIOR ART --.

Column 1
Line 13; after "sheet" insert -- . --.

Column 2
Line 32; delete "in addition," and insert -- In addition, --, therefor.
Line 49; delete "illumination" and insert -- Illumination --, therefor.

Column 7
Line 35; delete "Ethylene-allyl" and insert -- Ethylene-alkyl --, therefor.

Column 8
Line 11; delete "(c')," and insert -- (c')), --, therefor.

Column 9
Line 43; delete "melt," and insert -- melt --, therefor.

Column 11
Line 32; delete "50N/cM$^2$," and insert -- 50N/cm$^2$, --, therefor.

Column 14
Line 28; Claim 9, delete "claim 2," and insert -- claim 2 --, therefor.

Signed and Sealed this

Eleventh Day of May, 2010

David J. Kappos
*Director of the United States Patent and Trademark Office*